United States Patent
MacDonald et al.

(10) Patent No.: US 10,104,761 B1
(45) Date of Patent: Oct. 16, 2018

(54) COOLING TECHNIQUES TO IMPROVE THERMAL PERFORMANCE OF ELECTROACOUSTIC DEVICE

(71) Applicant: Bose Corporation, Framingham, MA (US)

(72) Inventors: Thomas E. MacDonald, Boston, MA (US); Kevin Brousseau, Newton, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/634,740

(22) Filed: Jun. 27, 2017

(51) Int. Cl.
    *H05K 1/02* (2006.01)
    *H04R 3/00* (2006.01)
    *H04R 1/02* (2006.01)
    *H04R 27/00* (2006.01)

(52) U.S. Cl.
    CPC .......... *H05K 1/0203* (2013.01); *H04R 1/025* (2013.01); *H04R 3/007* (2013.01); *H04R 27/00* (2013.01)

(58) Field of Classification Search
    CPC .......... H05K 1/0203; H04R 9/06; H04R 1/28; H04R 1/2819; H04R 1/2857; H04R 1/2873; H04R 1/02; H04R 1/403; H04R 27/00
    See application file for complete search history.

(56) References Cited

U.S. PATENT DOCUMENTS

| | | | |
|---|---|---|---|
| 3,779,551 A | 12/1973 | Grodinsky | |
| 4,227,051 A | 10/1980 | Thomas et al. | |
| 4,314,620 A | 2/1982 | Gollehon | |
| 4,704,553 A | 11/1987 | Resnicow | |
| 4,837,839 A | 6/1989 | Andrews | |
| 5,771,154 A * | 6/1998 | Goodman | H04R 1/00 174/16.3 |
| 6,243,472 B1 * | 6/2001 | Bilan | H04R 1/06 29/594 |
| 6,259,798 B1 | 7/2001 | Perkins et al. | |

(Continued)

FOREIGN PATENT DOCUMENTS

| CN | 102026053 B | 7/2013 |
|---|---|---|
| CN | 203178889 U | 9/2013 |

(Continued)

OTHER PUBLICATIONS

Related U.S. Appl. No. 15/634,081, filed Jun. 27, 2017, 36 pages.

(Continued)

*Primary Examiner* — Mohammad Islam
(74) *Attorney, Agent, or Firm* — Schmeiser, Olsen & Watts LLP

(57) ABSTRACT

A loudspeaker assembly comprises an enclosure having a first end and a second end, the first end including an opening; an acoustic driver at the second end of the enclosure; an acoustic volume between the first end and the second of the enclosure; a circuit board at the first end of the enclosure; a firebox covering the opening at the first end of the enclosure, the firebox providing a convection flow path in the acoustic volume over heat-generating components of the circuit board; and a heat sink extending from the circuit board in a direction away from the acoustic volume for providing a conduction flow path through the circuit board.

19 Claims, 5 Drawing Sheets

(56) References Cited

U.S. PATENT DOCUMENTS

| | | | |
|---|---|---|---|
| 6,453,378 B1* | 9/2002 | Olson | G06F 1/1632 |
| | | | 361/679.41 |
| 6,477,799 B1 | 11/2002 | Erickson et al. | |
| 6,723,913 B1 | 4/2004 | Barbetta | |
| 6,944,024 B1 | 9/2005 | Devine, III | |
| 7,302,061 B2 | 11/2007 | Rivera | |
| 7,475,506 B2 | 1/2009 | Hernandez et al. | |
| 8,051,592 B2 | 11/2011 | Chang | |
| 8,126,180 B2 | 2/2012 | Jacob et al. | |
| 8,135,158 B2 | 3/2012 | Fincham | |
| 8,189,823 B2 | 5/2012 | Tezuka et al. | |
| 8,561,756 B2 | 10/2013 | Litovsky et al. | |
| 8,646,195 B2 | 2/2014 | Fu et al. | |
| 9,294,842 B2 | 3/2016 | Qiu | |
| 2006/0039571 A1* | 2/2006 | Harris | H04R 9/022 |
| | | | 381/87 |
| 2010/0111342 A1 | 5/2010 | Jacob et al. | |
| 2011/0164774 A1* | 7/2011 | Gladwin | H04R 5/02 |
| | | | 381/332 |
| 2013/0022221 A1 | 1/2013 | Kallai et al. | |
| 2013/0251188 A1 | 9/2013 | Hatton et al. | |
| 2013/0314619 A1* | 11/2013 | Sugiura | H04N 5/64 |
| | | | 348/836 |
| 2015/0201255 A1* | 7/2015 | Porter | H04R 1/00 |
| | | | 381/334 |
| 2015/0281866 A1 | 10/2015 | Williams et al. | |
| 2015/0289037 A1 | 10/2015 | Kutil et al. | |
| 2016/0205466 A1 | 7/2016 | Lim | |
| 2016/0337756 A1 | 11/2016 | Oliveira et al. | |

FOREIGN PATENT DOCUMENTS

| | | |
|---|---|---|
| CN | 203995589 U | 12/2014 |
| CN | 205693881 U | 11/2016 |
| CN | 205726396 U | 11/2016 |
| DE | 202007015371 U1 | 3/2009 |
| JP | 6269076 A | 9/1994 |
| JP | 2000148027 A | 5/2000 |
| JP | 200423148 | 1/2004 |
| JP | 2005300618 A | 10/2005 |
| TW | 201409433 A | 3/2014 |
| TW | I448160 B | 8/2014 |
| WO | 9903375 A1 | 1/1999 |
| WO | 2016135517 A2 | 9/2016 |

OTHER PUBLICATIONS

Related U.S. Appl. No. 15/634,508, filed Jun. 27, 2017, 22 pages.

Non-Final Office Action in U.S. Appl. No. 15/634,081 dated Jun. 13, 2018; 15 pages.

International Search Report and Written Opinion in International Patent Application No. PCT/US2018/028527 dated Jul. 13, 2018; 21 pages.

International Search Report and Written Opinion in International Patent Application No. PCT/US2018/033840 dated Jul. 23, 2018; 16 pages.

* cited by examiner

COOLING TECHNIQUES TO IMPROVE THERMAL PERFORMANCE OF ELECTROACOUSTIC DEVICE

BACKGROUND

This description relates generally to acoustic speakers, and more specifically, to systems and methods for cooling a printed circuit board (PCB) of a portable powered public address (PA) speaker sound system.

BRIEF SUMMARY

In accordance with one aspect, a loudspeaker assembly comprises an enclosure having a first end and a second end, the first end including an opening; an acoustic driver at the second end of the enclosure; an acoustic volume between the first end and the second of the enclosure; a circuit board at the first end of the enclosure; a firebox covering the opening at the first end of the enclosure, the firebox including a plurality of air vents for heat-generating components of the circuit board and for providing a natural or forced convection flow path in the acoustic volume over the heat-generating components of the circuit board; and a heat sink for providing a conduction flow path through the circuit board.

Aspects may include one or more of the following features.

The circuit board may include a printed circuit board, and the printed circuit board may have a first side including a first set of electronic components surrounded by the firebox.

The first set of electronic components may be cooled by both the convection flow path and the conduction flow path.

The printed circuit board may have a second side opposite the first side facing the acoustic volume and including a second set of electronic components, and the second set of electronic components maybe cooled by the conduction flow path.

The firebox may include a plurality of vents that surround a surface of the circuit board having the heat-generating components and draw air from the convection path in the acoustic volume to cool the heat-generating components on the circuit board.

The loudspeaker assembly may further comprise at least one acoustic port that draws cooler air from an external environment, and the convection flow path may extend from the at least one acoustic port through the acoustic volume to the circuit board.

At least a portion of the circuit board and the firebox may separate the internal acoustic chamber from an external environment.

The second set of electronic components may produce heat than the first set of electronic components, and face the acoustic volume for cooling by both the convection flow path and the conduction flow path.

In accordance with another aspect, a system for cooling a loudspeaker assembly, comprises a firebox about a set of heat-generating components in an acoustic volume of the loudspeaker assembly; at least one acoustic port that draws cooler air from an external environment into the acoustic volume, wherein a natural or forced convection flow path extends from the at least one acoustic port through the acoustic volume and the firebox box to the heat-generating components; and a heat sink between the heat-generating components and the external environment for providing conduction flow path for the heat-generating components from the acoustic volume to the external environment.

Aspects may include one or more of the following features.

The firebox may include a plurality of vents that surround a surface of a circuit board having the heat-generating components and draw air from the convection flow path in the acoustic volume to cool the heat-generating components on the circuit board.

The heat-generating components of the circuit board may include a first set of electronic components surrounded by the firebox and may be cooled by both the convection flow path and the conduction flow path.

The heat-generating components of the circuit board may include a second set of electronic components on an opposite side of the circuit board as the first set of electronic components, and cooled by the conduction flow path.

At least a portion of the circuit board and the firebox may separate the internal acoustic chamber from the external environment.

The firebox and at least a portion of the circuit board may separate the acoustic volume from the external environment so that heat generated by the heat-generating components inside the acoustic volume may escape only from the at least one acoustic port.

In accordance with another aspect, a method for cooling a loudspeaker assembly comprises forming, in an acoustic volume of the loudspeaker assembly, a natural or forced convection flow path from an acoustic port at one side of the acoustic volume to a plurality of vents in a firebox at another side of the acoustic volume; forming a conduction flow path from heat-generating components of a circuit board the loudspeaker assembly to a heat sink on an opposite side of the circuit board as the acoustic volume; and cooling the electronic components of the loudspeaker assembly by both the conduction flow path and the convection flow path.

Aspects may include one or more of the following features.

The firebox may surround the heat-generating components of the circuit board and may provide for the convection flow path in the acoustic volume over the heat-generating components of the circuit board.

The vents of the firebox may surround a surface of the circuit board and draw air from the convection path in the acoustic volume to cool the heat-generating components.

The heat sink may extend from the circuit board in a direction away from the acoustic volume for providing the conduction flow path through the circuit board.

The heat-generating components of the circuit board may include a first set of electronic components on one side of the circuit board facing the acoustic volume that is cooled by both the convection and conduction flow paths, and may further include a second set of electronic components on an opposite side of the circuit board as the first set of electronic components that is cooled by the conduction flow path.

BRIEF DESCRIPTION

The above and further advantages of examples of the present inventive concepts may be better understood by referring to the following description in conjunction with the accompanying drawings, in which like numerals indicate like structural elements and features in various figures. The drawings are not necessarily to scale, emphasis instead being placed upon illustrating the principles of features and implementations.

DETAILED DESCRIPTION

Public address (PA) speaker systems are well-known for amplifying the reproduction of sound to be heard by a group of people. However, much of the power delivered to a loudspeaker for operation is turned into heat, and addition to heat-generating components such as the power supply, voice coil, motor magnet, battery, resistor capacitor (RC) circuits, and so on, which must be removed to prevent thermal damage to the contents of the loudspeaker, especially its electronic components, and provide a negative impact on its performance.

For example, a powered speaker typically includes a power supply, amplifier and other control electronics. The power supply converts AC to DC to power the amplifier which increases the gain of the audio input signal. In doing so, the circuitry of the control electronics experience efficiency loss resulting in heat dissipation. The heat must be removed from the circuits to prevent them from experiencing thermal breakdown.

In brief overview, examples of the inventive concepts address the foregoing issues faced by conventional powered speakers by configuring the speaker to include both thermal conduction to an aluminum heat sink and the formation of convection cooling paths for moving air inside the acoustic volume. For example, when the speaker is turned on and no audio is playing the heat will escape through firebox vents into the cooler acoustic volume by natural convection. When the powered speaker is playing audio the woofer will move the air, therefore accelerating the heat removal by forced convection.

Figure 1:
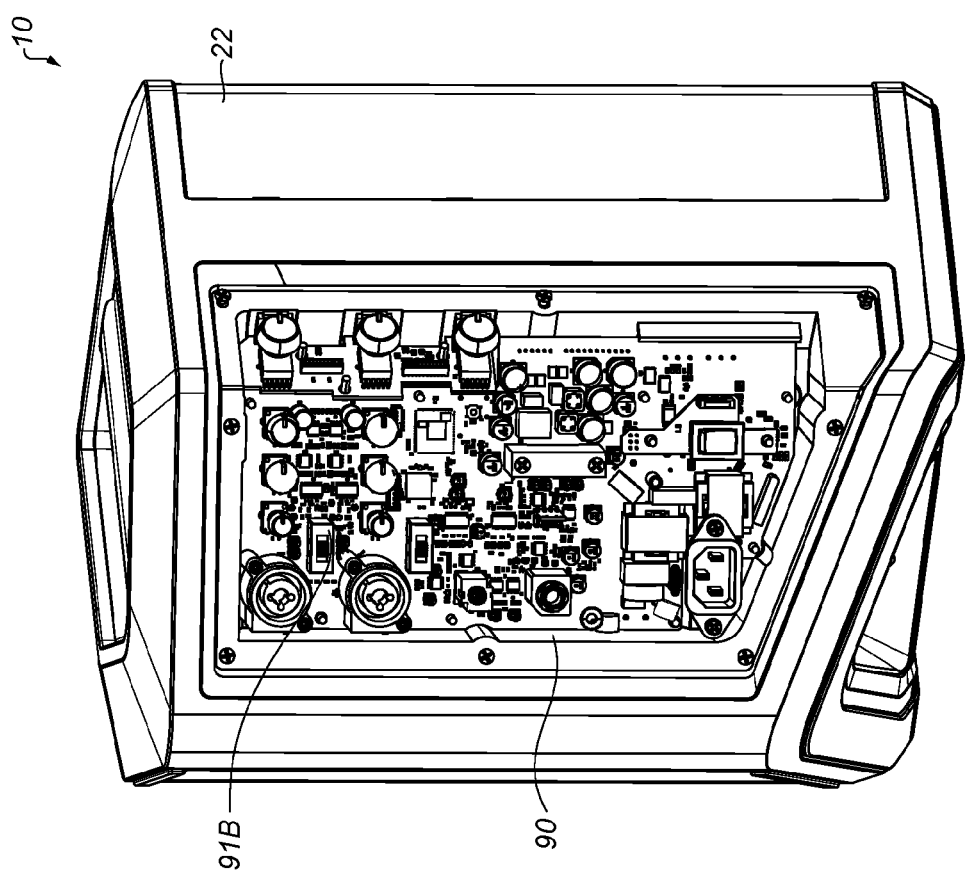
FIG. 1 is a perspective view of a portable powered public PA loudspeaker system assembly, in accordance with some examples.

Referring to FIG. 1, a portable powered public PA loudspeaker system assembly 10 comprises a circuit board 90 such as a printed circuit board (PCB) or the like populated with heat-producing electronic components that produce heat. The enclosure 22 (also referred to as a housing or cabinet) may include but not be limited to a top portion, a base, and side surfaces that collectively form an interior in which the circuit board 90 as well as one or more acoustic drivers 82, or speakers, and other well-known heat-producing components such as a power supply, battery amplifier electronics, and so on are positioned. In addition, the interior of the enclosure 22 provides a sufficient acoustic volume for allowing an audio-producing operation to be performed by the acoustic drivers 82.

The circuit board 90 is constructed and arranged so that some heat-generating electronic components 91A such as a resistor capacitor (RC) circuit, primary transformer, and power transistor such as a field effect transistor (FET), and/or other components providing high heat generation are positioned at an acoustic volume side of the circuit board 90 and face the acoustic driver 82 in the acoustic volume 85, i.e., positioned in the acoustic volume of the enclosure 22. These components are placed near the air flow generated by the transducers for maximum cooling. Other electronic components 91B producing lesser amounts of heat and a heatsink 112 are on the opposite side of the circuit board 90, i.e. external to the acoustic volume 85 of the enclosure 22.

In addition to providing electronic components 91A, B (generally, 91) for the loudspeaker system 10, the circuit board 90, in connection with a firebox 110, may also provide a barrier. In particular, air inside the acoustic volume 85 must be sealed except for the port audio path. Vents 114 are provided in the firebox 110 that allow air to cool the electronics 91 on the circuit board 90 but this air must not leak out to the exterior otherwise it will produce an unwanted sound. The circuit board 90 acts as a barrier to prevent such air leakage. The firebox 110 may include a set of stiffening ribs to strengthen the firebox and stop any vibrations.

In doing so, the circuit board 90 may be along both a convection cooling path inside the acoustic volume 85, i.e., for cooling the interior of the loudspeaker system assembly 10, and also along a conduction heat flow path to the heat sink 112 collocated with second electronic components 91B extending from the second side of the circuit board 90.

The firebox 110 covers an opening of the enclosure 22, and surrounds the circuit board 90 at the opening to the enclosure 22, or more specifically, a top surface of the circuit board 90 including heat generating components exposed to the acoustic volume 85, to separate the acoustic volume 85 from the external environment. The firebox 110 is required by government safety regulations, for example, UL approval, in the event of a fire caused by an electronics short circuit. The firebox 110 prevents any such fire to be contained from spreading and catch flammable materials on fire. The firebox 110 may be formed of plastic or other composite material. The material used to form the firebox 110 may be a thermoplastic alloy, for example, including polycarbonate and acrylonitrile-butadiene-styrene (PC/ABS) to provide flame retardancy, which has a UL94-V0 rating or related rating required by safety standards to prevent the plastic from igniting/burning outside a predetermined set of safety requirements.

The firebox 110 includes a plurality of vents 114 positioned between the acoustic volume 85 of the enclosure 22 and the circuit board 90 to provide a convection cooling path from the acoustic driver and acoustic port 92 to the circuit board 90, and more specifically, to direct cooling air at the electronic components of the circuit board 90. For example, the vents 114 may be positioned directly over some or all of the electronic components 91A on the side of the circuit board 90 facing the vents 114 inside the enclosure 22. The periphery of the firebox 110 provides a seal about the opening of the enclosure 22 so that air in the acoustic volume 85—will not leak.

Figure 3:
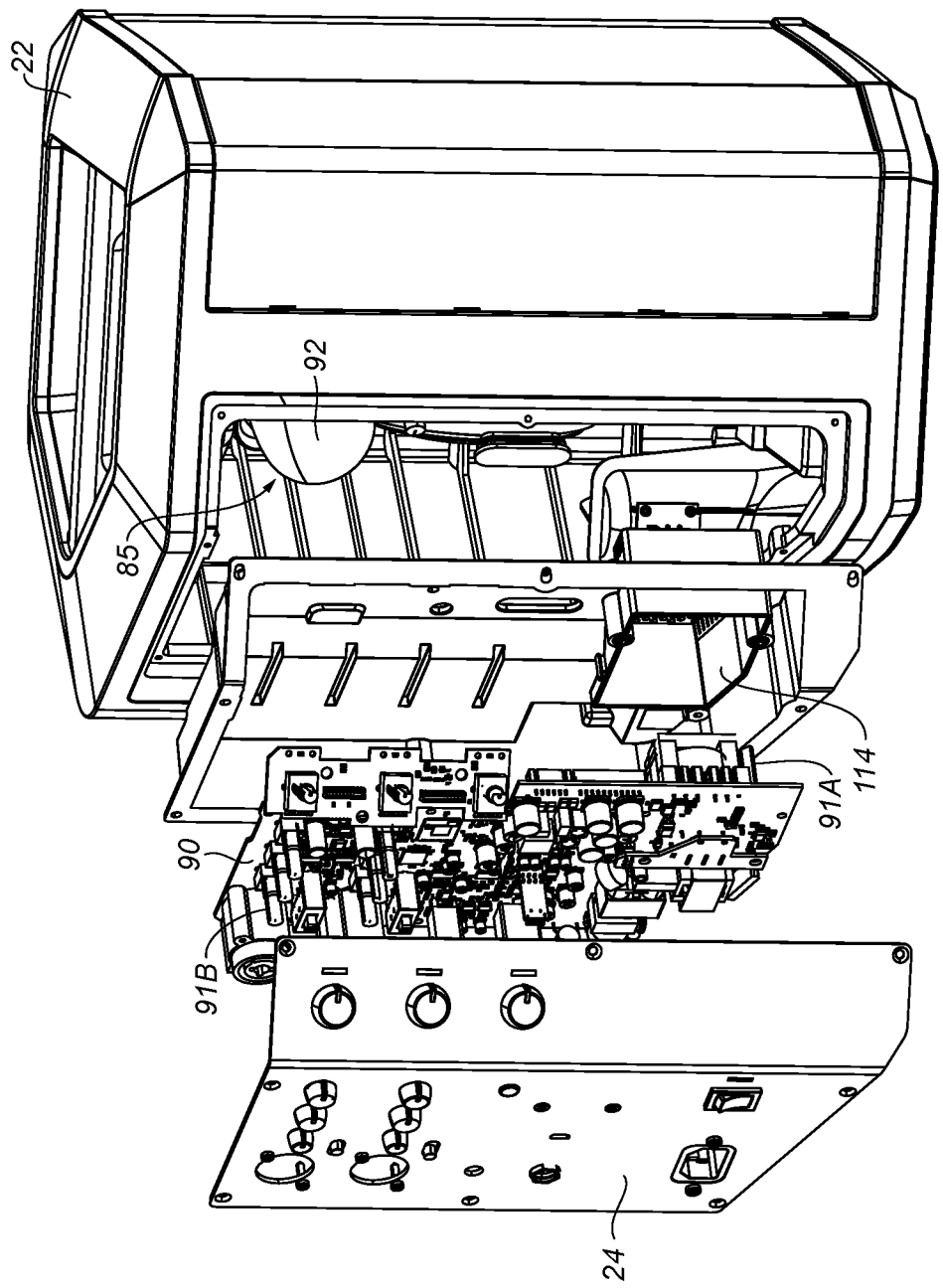
FIG. 3 is an exploded view of the loudspeaker system assembly of FIGS. 1 and 2.

Also, as shown in FIG. 3, a grille, screen, or panel 24 may cover a side surface of the enclosure 22, and be positioned over the circuit board 90. The panel 24 may receive a set of control elements from the circuit board 90 such as volume, tuning, reverb, bass, and/or treble knobs, power source connectors, input connectors, on/off switches, microphone/line switches, instrument jacks, stereo inputs, auxiliary inputs, and so on.

Figure 2:
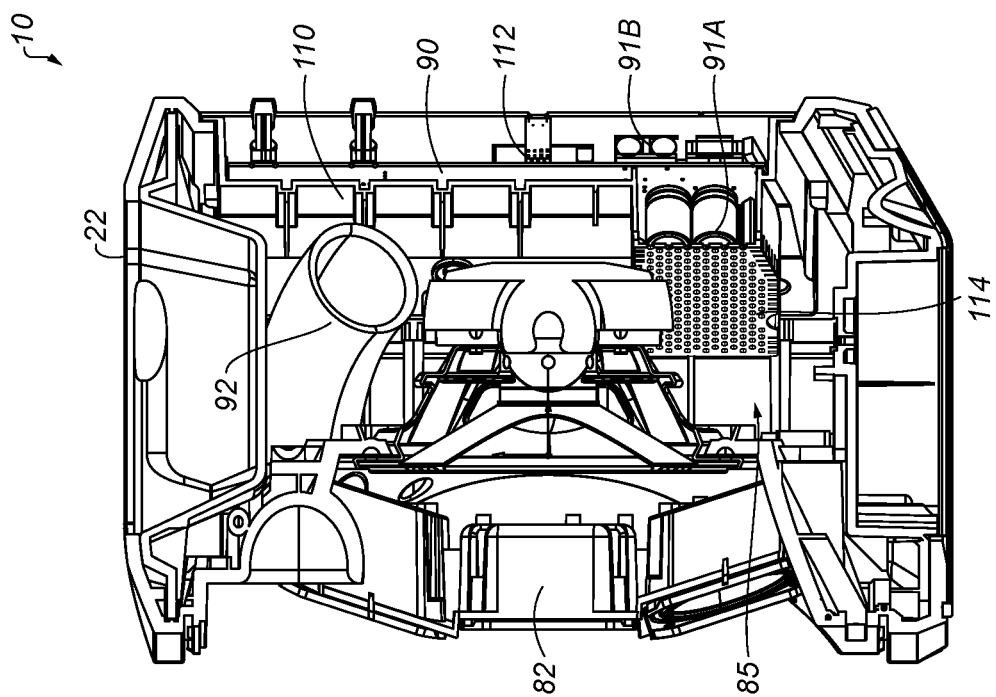
FIG. 2 is a cutaway view of the loudspeaker system assembly of FIG. 1
Figure 4:
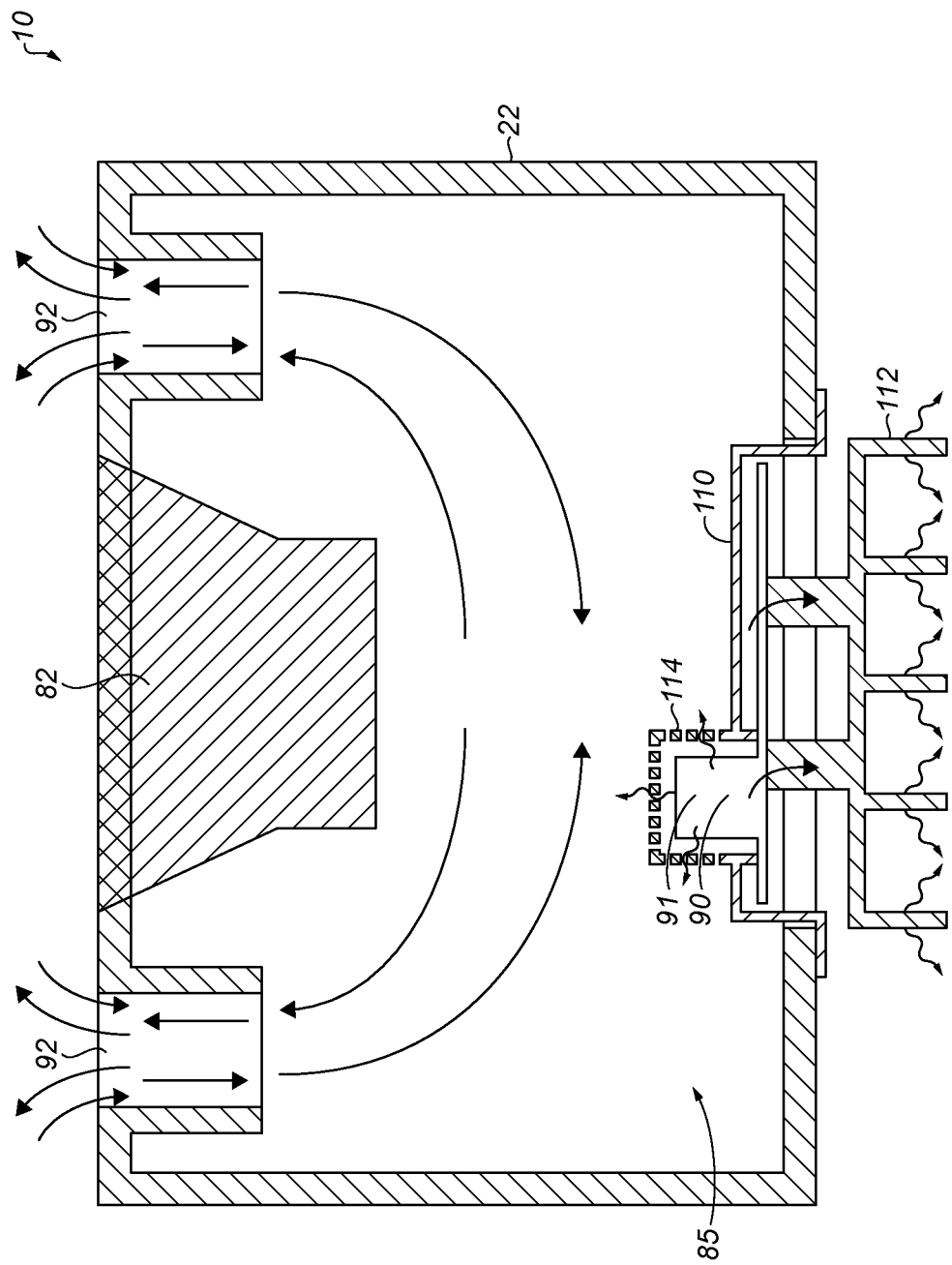
FIG. 4 is another cutaway view of the loudspeaker system assembly of FIGS. 1-3, including flow arrows illustrating a thermal flow between elements of the assembly.

Accordingly, in some examples, a system is provided for cooling an electroacoustic device such as the loudspeaker system assembly 10 of FIG. 1. As shown in FIGS. 2-4, the system includes but not limited to the circuit board 90 as well as enclosure acoustic ports 92, acoustic volume 85, firebox 110, heat sink 112, and air vents 114 for performing a combination of conduction heat flow and convection cooling, for example, natural convection or forced convection.

For example, as shown in FIG. 4, a natural convection flow path is formed by the acoustic ports 92 receiving a natural flow of air and circulating the air through the internal volume 85. Also, as shown in FIG. 3, the air vents 114 of the firebox 110 may be located over particular heat-producing electronic components 91A, such as an RC circuit, a transformer, and so on, so that during convection cooling the air flows over and about the electronic components 91A on the side of the circuit board 90 inside the enclosure 22. Here, the temperature inside the enclosure 22 can be reduced by natural convection cooling by the air vents 114 in the enclosure 22 and ports 92. As previously described, the circuit board 90 may serve as a barrier, so that the firebox 110 and at least a portion of the circuit board 90 separate the internal acoustic chamber 85 from the external environment. In doing so, heat inside the acoustic volume 85 can escape only from the air ports 92. Thus, heat is removed from the card cage to an ambient environment, while the air ports 92 may also draw cooler air into the enclosure 22 from an environment external to the system, and the firebox vents 114 allow the cooler air in the acoustic volume 85 to cool the electronics 91 on the circuit board 90.

In other approaches, heat generated by the electronic components 91 on the circuit board 90 can also be at least partially removed by conductive cooling, i.e., dissipation or removal of heat from the circuit board 90 via the heat sink 112, which conducts heat away from the electronic components 91 on the circuit board 90 for transfer to the ambient environment.

Accordingly, heat that is generated inside the enclosure 22 can be removed by one or more conduction cooling paths and convection cooling paths (shown by arrows in FIG. 4) formed between the heat-generating components in the enclosure 22 and an ambient environment.

Figure 5:
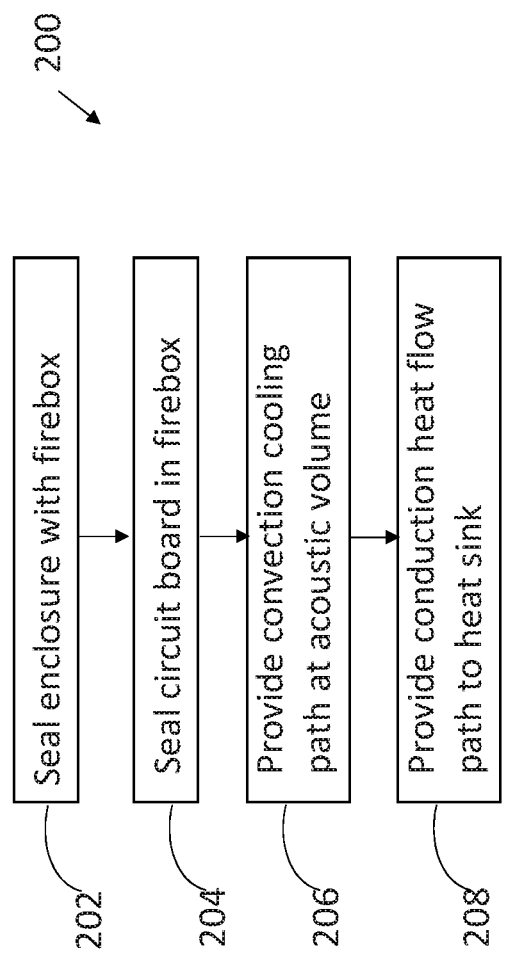
FIG. 5 is a flow diagram of a method for cooling a powered speaker, in accordance with some examples.

FIG. 5 is a flow diagram of a method 200 for cooling a powered speaker, in accordance with some examples. The method 200 may be performed at the portable powered public PA loudspeaker system assembly 10 of FIGS. 1-4.

At block 202, the enclosure 22 is sealed by positioning the firebox 110 at its opening.

At block 204, the circuit board 90 is sealed inside the firebox 110.

At block 206, during operation of the assembly 10, a convection cooling path is formed in the acoustic volume 85, and directed in a manner established by the presence of the firebox 110 and circuit board 90.

At block 208, a conduction heat flow path is formed from the electronic components 91 on the circuit board 90 to a heat sink extending from the circuit board 90 in a direction away from the acoustic volume 85.

It is to be understood that the foregoing description is intended to illustrate and not to limit the scope of the invention, which is defined by the scope of the appended claims. Other embodiments are within the scope of the following claims.

What is claimed is:

1. A loudspeaker assembly, comprising:
an enclosure having a first end and a second end, the first end including an opening;
an acoustic driver at the second end of the enclosure;
an acoustic volume between the first end and the second of the enclosure;
a circuit board at the first end of the enclosure;
a firebox covering the opening at the first end of the enclosure and further positioned over the circuit board, the firebox providing a natural or forced convection flow path in the acoustic volume over heat-generating components of the circuit board; and
a heat sink extending from the circuit board in a direction away from and external to the acoustic volume for providing a conduction flow path through the circuit board, wherein a portion of the heat sink extends through the opening at the first end of the enclosure, and wherein the circuit board is between the heat sink and the acoustic driver.

2. The loudspeaker assembly of claim 1, wherein the circuit board includes a printed circuit board, and wherein the printed circuit board has a first side including a first set of electronic components surrounded by the firebox.

3. The loudspeaker assembly of claim 2, wherein the first set of electronic components are cooled by both the convection flow path and the conduction flow path.

4. The loudspeaker assembly of claim 3, wherein the printed circuit board has a second side opposite the first side facing the acoustic volume and including a second set of electronic components, and wherein the second set of electronic components are cooled by the conduction flow path.

5. The loudspeaker assembly of claim 4, wherein the second set of electronic components produce heat than the first set of electronic components, and face the acoustic volume for cooling by both the convection flow path and the conduction flow path.

6. The loudspeaker assembly of claim 1, wherein the firebox includes a plurality of vents that surround a surface of the circuit board having the heat-generating components and draw air from the convection path in the acoustic volume to cool the heat-generating components on the circuit board, wherein the heat-generating components of the circuit board are between the vents and the opening at the first end of the enclosure.

7. The loudspeaker assembly of claim 1, further comprising at least one acoustic port that draws cooler air from an external environment, wherein the convection flow path extends from the at least one acoustic port at the second end of the enclosure through the acoustic volume to the circuit board, and the conduction flow path is at the first end of the enclosure.

8. The loudspeaker assembly of claim 1, wherein at least a portion of the circuit board and the firebox separate the internal acoustic chamber from an external environment.

9. A system for cooling a loudspeaker assembly, comprising:
a firebox about a set of heat-generating components in an acoustic volume of the loudspeaker assembly;
at least one acoustic port at an opposite end of the acoustic volume than the firebox that draws cooler air from an external environment into the acoustic volume, wherein a natural or forced convection flow path extends from the at least one acoustic port at the opposite end of the acoustic volume than the firebox and through the acoustic volume and the firebox box to the heat-generating components; and
a heat sink between the heat-generating components and the external environment for providing conduction flow path for the heat-generating components from the acoustic volume to the external environment, wherein the heat-generating components are between the heat sink and the at least one acoustic port.

10. The system of claim 9, wherein the firebox includes a plurality of vents that surround a surface of a circuit board having the heat-generating components and draw air from the convection flow path in the acoustic volume to cool the heat-generating components on the circuit board.

11. The system of claim 9, wherein the heat-generating components of the circuit board include a first set of electronic components surrounded by the firebox that is cooled by both the convection flow path and the conduction flow path.

12. The system of claim 11, wherein the heat-generating components of the circuit board include a second set of electronic components on an opposite side of the circuit board as the first set of electronic components, and are cooled by the conduction flow path.

13. The system of claim 9, wherein at least a portion of the circuit board and the firebox separate the internal acoustic chamber from the external environment.

14. The system of claim 9, wherein the firebox and at least a portion of the circuit board separate the acoustic volume from the external environment so that heat generated by the heat-generating components inside the acoustic volume escapes only from the at least one acoustic port.

15. A method for cooling a loudspeaker assembly, comprising:
   forming, in an acoustic volume of the loudspeaker assembly, a convection flow path from an acoustic port at one side of the acoustic volume to a plurality of vents in a firebox at another side of the acoustic volume;
   forming a natural or forced conduction flow path from heat-generating components of a circuit board the loudspeaker assembly to a heat sink on an opposite side of the circuit board as the acoustic volume, wherein the vents in the firebox are positioned over the heat-generating components, and wherein the heat-generating components are positioned between the heat sink and the acoustic port; and
   cooling the electronic components of the loudspeaker assembly by both the conduction flow path and the convection flow path.

16. The method of claim 15, wherein the firebox surrounds the heat-generating components of the circuit board and provides for the convection flow path in the acoustic volume over the heat-generating components of the circuit board.

17. The method of claim 16, wherein the vents of the firebox surround a surface of the circuit board and draw air from the convection path in the acoustic volume to cool the heat-generating components.

18. The method of claim 15, wherein the heat sink extends from the circuit board in a direction away from the acoustic volume for providing the conduction flow path through the circuit board.

19. The method of claim 18, wherein the heat-generating components of the circuit board include a first set of electronic components on one side of the circuit board facing the acoustic volume that is cooled by both the convection and conduction flow paths, and further include a second set of electronic components on an opposite side of the circuit board as the first set of electronic components that is cooled by the conduction flow path.

* * * * *